Figure 1:
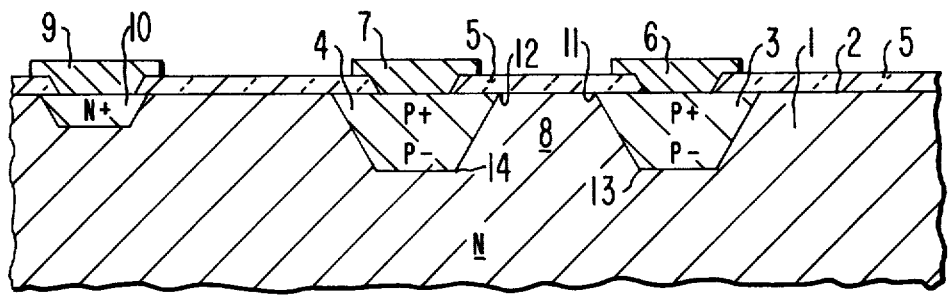

United States Patent [19]

Martinelli et al.

[11] 4,005,451
[45] Jan. 25, 1977

[54] LATERAL CURRENT DEVICE

[75] Inventors: Ramon Ubaldo Martinelli, Hightstown; Henry Kressel, Elizabeth, both of N.J.

[73] Assignee: RCA Corporation, New York, N.Y.

[22] Filed: May 5, 1975

[21] Appl. No.: 572,615

[52] U.S. Cl. .................................. 357/35; 357/20; 357/55; 357/90
[51] Int. Cl.[2] .................. H01L 29/72; H01L 29/06
[58] Field of Search ............... 357/35, 55, 56, 20, 357/89, 90

[56] References Cited
UNITED STATES PATENTS

| 3,283,223 | 11/1966 | DeWitt et al. ..................... 357/35 |
| 3,644,799 | 2/1972 | Weisshaar ......................... 357/56 |
| 3,880,675 | 4/1975 | Tarui et al. ........................ 357/35 |

Primary Examiner—William D. Larkins
Assistant Examiner—Gene M. Munson
Attorney, Agent, or Firm—H. Christoffersen; R. P. Williams

[57] ABSTRACT

A lateral bipolar transistor includes spaced emitter and collector regions in a substrate, arranged so that lateral current will flow in a zone of the substrate relatively remote from a surface thereof. The emitter and collector regions are shaped or positioned to provide a shorter distance between them at the desired location for current flow.

9 Claims, 3 Drawing Figures

LATERAL CURRENT DEVICE

This invention relates to semiconductor devices in which the current flows substantially parallel to a major surface, i.e. they exhibit lateral current flow as opposed to devices in which current flow is into or out of a major surface substantially perpendicularly. For instance so-called "lateral transistors" exhibit lateral flow, and have shallow spaced emitter and collector electrode regions produced in a surface of a chip, e.g. a semiconductor substrate, and an effective base electrode region between the other two regions. The invention is particularly applicable to producing lateral transistors in a semiconductors substrate, for instance in an integrated circuit.

One of the difficulties in relying on lateral current flow is that it is parallel and close to the semiconductor surface which produces a perturbing effect on current flow, reducing amplification and also possibly reverse breakdown voltages when no current should flow. Moreover, the surface has usually to be covered in practice with some substance which will prevent electric, chemical or other external agents contacting the surface because these may change the operating characteristics. The passivating or insulating substance may be a layer produced from the semiconductor itself, e.g. silicon dioxide from silicon, but unfortunately its mere presence tends also, we find, to perturb the surface current flow. Semiconductor surfaces, free of coated, cause bending or conduction and valence bands, which leads to a high velocity surface recombination. This in the base region of any transistor reduces amplification.

This difficulty is enhanced by the fact that electrode regions produced by normal methods tend to be greatest in cross-section closest to the surface, which means that the distance between two such regions is least at the shallowest lateral current flow lines. Not only are the electrode regions not very deep anyway (typically two or three microns), but preferentially the current will flow at the shallowest levels. Even worse, another effect tending to bring the current flow closer to the perturbing surface-covering substance is that the doping or impurity level also tends to be highest near the shallowest parts of the electrode regions, so that it is here that the emitter carrier injection is highest, again tending to promote superficial, rather than deep, current flow.

In one prior proposal, to bring the current flow away from the surface, one of the two electrode regions is produced to lie in part very deep below the surface and to extend also in the lateral direction, such that edge portions of the other electrode region close to the semiconductor body surface are shielded from operating electric fields, and the path therefrom to a third electrode region is long and tortuous. The edge portions are thus ineffective to inject carriers or to participate electrically and surface currents are thus inhibited. By this proposal, however, production of the deep and extensive shielding electrode region involves considerable expenditure in time and equipment.

In another prior proposal, a lateral diode or transistor has a surrounding guard ring provided by a floating PN-junction. This and a junction of the component form a combined depletion region which inhibits surface current flow, and thus provides better protection against reverse breakdowns which tend to occur at the surface. No help is given by this prior proposal for increasing amplification factors, however, since only breakdowns are in question, and only an inhibiting effect is provided. Furthermore, the guard ring may use up valuable surface space.

The present invention decreases surface effects (such as carrier re-combination) on lateral current flows without either substantial reduction in the flow or appreciable use of extra substrate space, or having to produce buried and laterally extensive shielding electrode regions. In the present device, either of the spaced electrode regions or the semiconductor body itself is so shaped that lateral current flow is enhanced at a depth relatively remote from the perturbing surface, e.g. a passivation layer, in comparison with shallower lateral current flow. One or both of the regions may advantageously be more heavily doped at the deepest localities. A PNP lateral silicon transistor, with a silicon passivation layer, in an initially N-type body also forming the base region, very advantageously uses the teaching of the invention.

Figure 2:
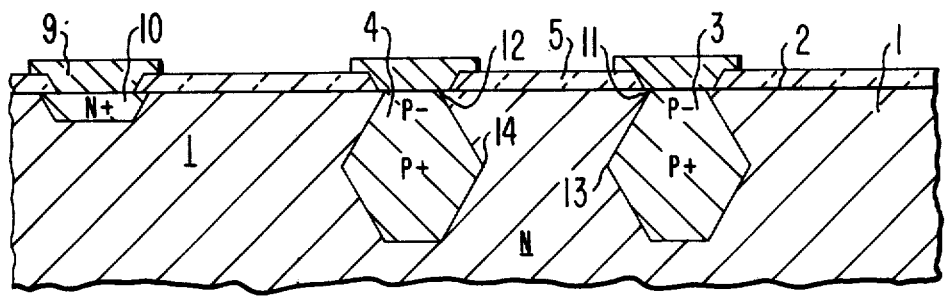
Figure 3:
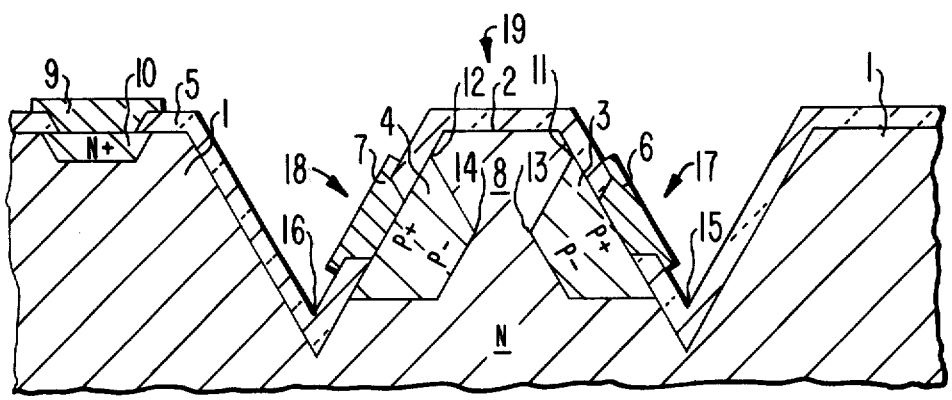

In the accompanying drawings:

FIG. 1 shows, diagrammatically and not to scale, a cross-sectional view of a prior art lateral flow device; and FIGS. 2 and 3 similarly show devices embodying the invention.

Referring to FIG.1 an N-type semiconductor substrate body 1 of moderate doping has produced therein by diffusion in from a major surface 2 an inner collector electrode region 3 and an outer emitter electrode region 4, which are stripes or ring-shapes, but appear side-by-side anyway as viewed in the drawing. The surface 2 is covered by a passivating, insulating layer 5 of silica, produced if desired from the silicon of the substrate. Through holes in the passivating layer 5 pass terminal metallization 6 and 7 which directly contact the top surfaces of collector and emitter respectively, to give electrical access to both.

The bulk N-material of the substrate 1 forms the base, of a lateral flow or lateral transistor, in which the effective part of the base for controlling the lateral emitter-collector current flow is that part referenced 8 lying between the other two regions 3 and 4. Base-part 8 is shaped like regions 3 and 4. electrical access to it is via a further metallization terminal 9 at a locality somewhere on the substrate, although not too remote from part 8, or base series resistance may increase undesirably. The terminal 9 contacts an N+ region 10 produced in the substrate to make good contact with the general N-region of the substrate bulk. Neither the N+ region 10 nor terminal 9 need be annular, and they need not lie on the same surface of the substrate as the collector and emitter.

The drawback which concerns us in such prior art lateral flow semiconductor devices is that the effective base 8 has a top portion, i.e. towards upper edges 11 and 12 of the collector and emitter regions, which offers a much shorter lateral flow path than the bottom portion of the base part 8, i.e. towards the lower edges 13 and 14 of the collector and emitter regions. Therefore more of the lateral current will tend to cross the top portion than the bottom portion of the intervening base part 8. Moreover, the top edges 11, 12 of the electrode regions 3 and 4 are more highly doped (as shown by the P+ symbols) than are the bottom P− edges 13 and 14, which leads to more efficient carrier (hole) injection from whichever one of the two is being used as the emitter, namely inner electrode 3. This enhances the above-mentioned tendency for the highest emitter/collector current flow to be closest to the surface.

Substantial superficial current flow is undesirable, especially with the presence of silica layer 5, because the presence of the nearby surface causes undesirable perturbations of such superficial flow, degrading amplification by surface recombination of the injected holes with the majority N-carriers of the base. Therefore, we would like to increase the deeper lateral flow, e.g. between lower electrode edges 13 and 14 where such perturbations are least, at the expense of the shallower lateral flow.

A typical reason why the above undesirable shapings and dopings of the electrode regions 3 and 4 occur, is because the regions may have been produced by diffusion, and more impurities remain at shallow depths. It is also owing to the diffusion process that the surface parts of these electrodes have greatest cross-section.

FIG. 2 shows one arrangement reversing the above-described tendency to surface flow, because the regions 3 and 4 have been produced to have different geometrical and doping profiles. In fact the regions have their greatest cross-sections and impurity contents at their greatest depths. All the items in the FIG. 2 embodiment have counterparts already described in the prior art device of FIG. 1 and are similarly referenced.

The essential difference between the devices is that the electrodes, preferably both, having their widest and most highly doped regions at the bottom as drawn, farthest from the surface, favor current flow between their lower edges 13, 14 rather than between their upper edges 11, 12. Surface effects for instance electron-hole recombination are thus much reduced, especially in the presence of layers, such as an SiO₂ passivation coating, which tend to provoke surface stresses leading to the increased surface recombining combatted by the invention.

The base terminal 9 as before may be anywhere on the substrate making satisfactory contact, perhaps with the help of a highly or degenerately doped region 10, with the base region 8. It is inadvisable to locate terminal 9 between the other two terminals 6 and 7 and over the region 8, however, because this would encourage injection of minority carriers from the upper edge 12 of the emitter.

A device such as that illustrated in FIG. 2 may be produced for example, as in any of the examples outlined below.

Example 1

Boron impurities are ion-implanted deep into the substrate silicon bulk. The silica passivation is preferably deferred until afterwards. The implanted boron region is then diffused upwards to the surface by heating the substrate. Diffusion will take place downwards as well but this is not in practice a significant factor. Sideways diffusion takes place, and helps the resulting P region to the desired tapering towards the surface form the ion-implanted center. Furthermore, the P region will be most heavily doped towards the ion-implant site, i.e. with increasing depth as illustrated by the P+, P− symbols in FIG. 2.

Example 2

Alternatively, the boron centers or pockets can be ion-implanted or diffused as a first step on the surface of the N-type substrate, and a layer of N-Si can be epitaxially grown to about 3 microns thickness over the boron pockets. Subsequently, the substrate is heated to cause the diffusion upward and outward with the same result as in Example 1. The SiO₂ passivation may be produced or deposited at any time on the N-Si surface. Some boron diffusion will have taken place during the heating involved in the N-Si deposition.

Example 3

A graded impurity P-layer is epitaxially grown, using a mask, at sites in the N-Si substrate at which wells have been provided. The bottoms of the wells are covered with p+ silicon, and the deposit is graded to p− at the top. The obtaining of the inverted cone shapes at 3, 4 of FIG. 2 is automatic due to a sideways diffusion which occurs during the heating involved in the epitaxial deposition. The graded deposition gives the actual doping profile, and the lateral current flow is reduced or negligible near the perturbing surface as described above.

Another embodiment of the invention illustrated in FIG. 3 has the internal location lateral flow of the invention promoted by appropriate configuration of the substrate, in fact the major surface in which the electrodes are produced, rather than configuration of the electrodes 3, 4 themselves. In fact, although the electrode region configurations indeed could be inverted cones after the style of the FIG. 2 embodiment, this is often unnecessary and FIG. 3 illustrates electrodes of the same individual shapes relative to the surface as have the electrodes of the FIG. 1 prior art device. In contrast, local inclinations of the major surface produce the benefits of the invention, of shorter internal flow paths.

In FIG. 3, again like or analogous items are referenced as in the previous figures. However, two depressions 15, 16, V-shaped as viewed in cross-section, in the top surface of the substrate, distinguish the FIg. 3 embodiment from the preceding devices. The depressions, which are shown with exaggerated sharp angles, serve to provide inclined annular faces 17 and 18 on the generally or otherwise flat major surface shown. There may be a radially short face 19 between the inclined faces, which face 19 is coplanar with the rest of the generally flat surface as shown, or it may exhibit a rounded, convex surface, which gives a longer leakage path. The electrode regions 3 and 4 have been produced by diffusion in faces 17 and 18. The two depressions 15 and 16 may also be portions of a single, continuous annular depression (not shown).

Faces 17 and 18 are sufficiently inclined for the electrode regions 3 and 4, which taper towards their portions furthest from the surface faces 17 and 18, to have their lowest edges 13 and 14 closest to each other. The angles of taper may correspond with those of regions 3 and 4 of FIG. 1, since it is assumed that these regions are all produced by diffusion-in from the substrate surface. Although no special diffusion steps or precautions need be taken, then, the closest distance between the collector and emitter regions is, as for FIG. 2, remote from the surface, so that surface perturbations of the lateral current flow are again only of consequence to a small proportion of the flow. With this configuration of the surface, where the electrodes (and their associated terminals) are wholly on inclined faces 18, 17 of the major surface 2, even the shallowest lateral flow path, presented by edges 11 and 12, is somewhat more spaced from the intervening horizontal face 19 of the substrate than are the shallowest lateral flows of the devices of FIG. 1 or FIG. 2 from the intervening surface 2. The surface perturbations may be even less, therefore, in the FIG. 3 embodiment. In compensation, the last embodiment has a drawback in that the lowest edges 13 and 14 have the least doping, leading to a reduced injection efficiency for holes. The surface edges 11, 12 now have the highest carrier injection property, where of course, high injection is not required.

The device of FIG. 3 may be manufactured by first bevelling an N-Si wafer to the surface configuration shown in FIG. 3. A P- impurity such as boron is now diffused into the oppositely bevelled (perhaps 35°) faces 17 and 18, with the resulting emitter and collector regions being formed as shown, individually resembling those of FIG. 1. As aforesaid, the regions are closest at an inner portion of the base region 8 and even the upper base region current flow is not so close to passivation layer 5 at the intervening portion 19 of major surface 2. Although the bevelling of faces 18 and 17 is illustrated at an exaggerated angle to the general inclination of the major surface 2 (horizontal as illustrated), our presently preferred inclination is somewhere between 30° and 45° for silicon wafers as described. Probably the optimum depends to the diffusion conditions.

It is not necessary in the FIG. 3 embodiment to produce the regions by diffusion, obviously bevelling the electrode surfaces to face away from each other will anyway bring the farthest electrode regions closer together whatever their nature or geometry. It is envisaged that in some cases only one of the two regions need be in a bevelled face, thereby saving one bevelling operation and yet gaining the advantage of deeper lateral flow. In other cases, with both faces 17 and 18 bevelled, there need be no intervening non-bevelled region 19.

Although silicon lateral PNP - transistors with boron dopant have been described above in detail, other semiconductor materials, dopants, methods of preparation and types of device will occur to those skilled in the art. Devices having annular features of circular symmetry have been preferred but non-closed figures such as straight line configurations are permissible for the electrodes and other features.

What is claimed is:

1. A generally lateral current flow device comprising a semiconductor body having a surface, a surface layer on said surface of the body of a nature liable to perturb local lateral current flow therein, first and second electrode regions of a first conductivity type extending within the body from respective portions of said surface thereof, respective electrical access terminals on the body contacting at said surface the first and second electrode regions, a third electrode region of a second conductivity type lying between the first and second electrode regions and having an outer portion located along and close to the surface of the body and an inner portion lying less close thereto, a third electrical access terminal on the body contacting a region of said surface thereof located other than between the first two surface regions but being in electrical communication with the third electrode region; and the improvement providing a relative configuration of the first and second electrode regions leading to a shorter distance between them through said inner portion of the third region than that through said outer portion thereof.

2. A lateral current device according to claim 1 wherein the configuration of at least one of said first and second electrode regions is such that the dimension in the lateral direction increases with distance from the surface of the body.

3. A lateral current device according to claim 2 wherein at least one of the first and second electrode regions are produced to have doping levels also increasing with distance from the surface of the body.

4. A lateral current device according to claim 2 wherein the body comprises a substrate principally of the second conductivity type, and regions produced therein to provide said first and second electrode regions, said third region and its electrical communication path with the third terminal being provided by the substrate bulk material.

5. A lateral current device according to claim 4 wherein the concentration of impurities in at least one of the first and second regions increases with distance from the surface of the body.

6. A lateral current device according to claim 4 comprising a semiconductor N-type body as said substrate, and introduced boron impurity localities as said first and second electrode regions.

7. A generally lateral current flow device comprising a semiconductor body, a surface layer on the body of a nature liable to perturb local lateral current flow therein, first and second electrode regions of a first conductivity type extending within the body from respective surface regions thereof, respective electrical access terminals on the body contacting at said surface regions the first and second electrode regions, a third electrode region of a second conductivity type lying between the first and second electrode regions and having an outer portion located along and close to the surface of the body and an inner portion lying less close thereto, a third electrical access terminal on the body contacting a surface region thereof located other than between the first two surface regions but being in electrical communication with the third electrode region; and the improvement providing a relative configuration of the first and second electrode regions leading to a shorter distance between them through said inner portion of the third region than that through said outer portion thereof, wherein said body comprises first and second surface portions inclined at an angle to each other, said first and second electrode regions extending inwardly from respective ones of said first and second surface portions, and said shorter distance through said inner portion of the third region occurs by virtue of the selection of said angle between said first and second surface portions of the body.

8. A lateral current device according to claim 7 wherein both of said first and second surface portions are shaped so as to be bevelled oppositely with respect to a generally flat major surface of said body.

9. A lateral current device according to claim 8 being a silicon N-substrate base PNP generally planar transistor, wherein said first and second surface portions are bevelled oppositely and symmetrically at an angle between 30° and 45° to the general plane of the transistor.

* * * * *